(12) United States Patent
Ji et al.

(10) Patent No.: US 11,965,934 B2
(45) Date of Patent: Apr. 23, 2024

(54) DEVICE FOR MEASURING ELECTRODE POTENTIAL

(71) Applicant: LG ENERGY SOLUTION, LTD., Seoul (KR)

(72) Inventors: Sanggu Ji, Daejeon (KR); Hana Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 177 days.

(21) Appl. No.: 17/770,218

(22) PCT Filed: Nov. 5, 2020

(86) PCT No.: PCT/KR2020/015368
§ 371 (c)(1),
(2) Date: Apr. 19, 2022

(87) PCT Pub. No.: WO2021/096157
PCT Pub. Date: May 20, 2021

(65) Prior Publication Data
US 2022/0357401 A1 Nov. 10, 2022

(30) Foreign Application Priority Data
Nov. 15, 2019 (KR) .................. 10-2019-0147068

(51) Int. Cl.
*G01R 31/385* (2019.01)
*G01R 31/36* (2020.01)
*H01M 10/42* (2006.01)

(52) U.S. Cl.
CPC ....... *G01R 31/385* (2019.01); *G01R 31/3644* (2013.01); *H01M 10/4285* (2013.01)

(58) Field of Classification Search
CPC .................... H01M 10/4285; G01R 31/36
See application file for complete search history.

(56) References Cited

U.S. PATENT DOCUMENTS

| 4,636,732 A | 1/1987 | Willis |
| 2009/0104510 A1 | 4/2009 | Fulop et al. |

(Continued)

FOREIGN PATENT DOCUMENTS

| JP | 2011-3314 A | 1/2011 |
| KR | 10-2010-0075913 A | 7/2010 |

(Continued)

OTHER PUBLICATIONS

International Search Report (PCT/ISA/210) issued in PCT/KR2020/015368, dated Mar. 6, 2021.

*Primary Examiner* — Noam Reisner
(74) *Attorney, Agent, or Firm* — Birch, Stewart, Kolasch & Birch, LLP (57) ABSTRACT

A device for measuring electrode potential includes a body having an insertion portion to receive a cylindrical secondary battery with a separated beaded part formed on one surface thereof, a cover covering the one surface of the body, a working electrode terminal fixed to the body; and a counter electrode terminal fixed to the body. The insertion part includes a first insertion portion, into which a cap assembly of the cylindrical secondary battery is insertable, a second insertion portion, into which a case of the cylindrical secondary battery is insertable, and a third insertion portion, into which a first electrode tab of the cylindrical secondary battery is insertable. The second insertion part includes a case insertion portion, into which the case of the cylindrical secondary battery is insertable, and an injection portion, into which an electrolyte is injectable. A reference electrode terminal is connected to the injection portion.

20 Claims, 11 Drawing Sheets

(56) References Cited

U.S. PATENT DOCUMENTS

2012/0263986 A1    10/2012  Fulop et al.
2014/0023888 A1     1/2014  Fulop et al.
2019/0237738 A1*    8/2019  Kim .................... G01R 31/364

FOREIGN PATENT DOCUMENTS

| KR | 10-2013-0128030 A | 11/2013 |
| KR | 10-2015-0060373 A |  6/2015 |
| KR |    10-1690372 B1  | 12/2016 |
| KR | 10-2016-0039474 A |  4/2018 |
| KR | 10-2015-0082960 A |  7/2018 |
| KR | 10-2018-0082755 A |  7/2018 |
| KR | 10-2018-0137118 A | 12/2018 |

* cited by examiner

[FIG. 1]

CONVENTIONAL ART

[FIG. 2]

CONVENTIONAL ART

[FIG. 3]

CONVENTIONAL ART

DEVICE FOR MEASURING ELECTRODE POTENTIAL

TECHNICAL FIELD

The present disclosure relates to a device for measuring an electrode potential, and more particularly to a device for measuring an electrode potential of a three electrode system composed of a reference electrode, a working electrode, and a counter electrode.

BACKGROUND ART

Recently, as energy source price is increasing due to the depletion of fossil fuels and increasing interest is being paid to environmental pollution, the demand for environmentally-friendly alternative energy sources is bound to play an important role in the future life. Thus, research into techniques for generating various kinds of power, such as nuclear energy, solar energy, wind energy, and tidal power, is underway, and power storage apparatuses for more efficient use of the generated energy are also drawing much attention.

In particular, as technology development and demand for electric vehicles and mobile devices continue to increase, the demand for batteries as energy sources is rapidly increasing. Accordingly, a lot of research on batteries capable of satisfying various needs has been carried out.

As a representative example, a lithium secondary battery, such as a lithium ion battery or a lithium ion polymer battery, which have advantages such as a high energy density, a discharge voltage, an output stability, and the like is highly demanded.

In addition, the secondary batteries may be classified based on the structure of an electrode assembly, in which a positive electrode, a negative electrode, and a separator interposed between the positive electrode and the negative electrode are stacked. For example, the electrode assemblies may include a jelly-roll (wound) type electrode assembly in which long sheet type positive electrodes and negative electrodes are wound in a state where separators are interposed therebetween, and a stacked (laminated) type electrode assembly in which a plurality of positive electrodes and a plurality of negative electrodes, which are cut into predetermined unit sizes, are sequentially stacked in a state where separators are interposed therebetween, and the like. Recently, in order to solve the problems of the jelly-roll type electrode assembly and the stacked type electrode assembly, there have been developed a stacked/folded type electrode assembly having an improved structure, which is a combination of the jelly-roll type electrode assembly and the stacked type electrode assembly. The stacked/folded type electrode assembly has a structure in which unit cells stacked with certain units of the positive electrodes and unit negative electrode are wound with a separation film and so on while a separator is interposed therebetween.

Further, depending on the shape of a battery case, a secondary battery may be classified into a cylindrical battery having an electrode assembly mounted in a cylindrical metal container, a prismatic battery having an electrode assembly mounted in a prismatic metal container, or a pouch-shaped battery having an electrode assembly mounted in a pouch-shaped case formed of an aluminum laminate sheet.

Figure 1:
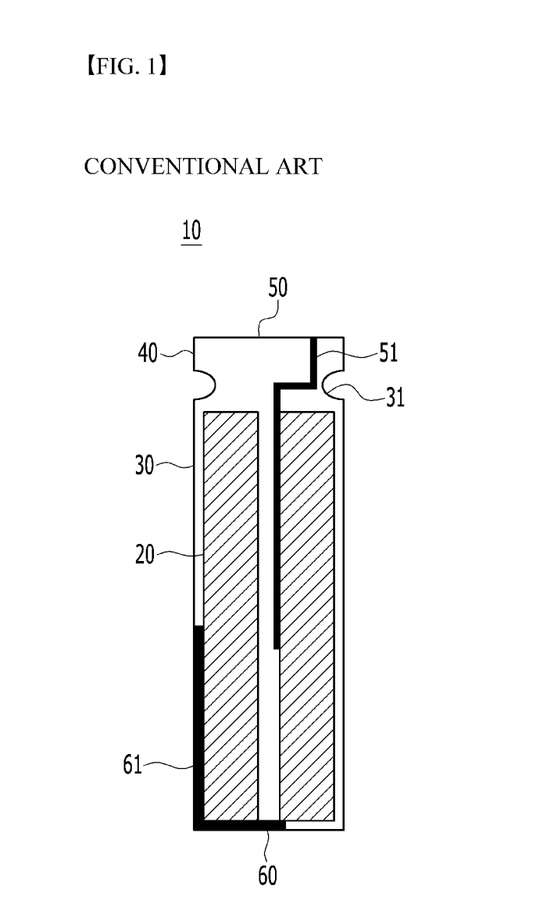
FIG. 1 is a schematic diagram schematically illustrating a structure of a cylindrical secondary battery.

FIG. 1 is schematically a schematic diagram schematically illustrating a structure of a cylindrical secondary battery 10.

Referring to FIG. 1, the cylindrical secondary battery 10 is manufactured by mounting a wound type electrode assembly 20 in a cylindrical case 30, injecting an electrolyte into the case 30, and coupling a cap assembly 40 provided with an electrode terminal to the opened upper end of the case 30.

Further, in the case 30, a beaded part 31 recessed in a central direction may be formed in order to stably couple the cap assembly 40 and prevent movement of the electrode assembly 20.

When the electrode assembly 20 is mounted in the case 30, a first electrode tab 51 and a second electrode tab 61 are protruded in directions that are opposite to each other. Moreover, the first electrode tab 51 is connected to the cap assembly 40 coupled to one opened surface of the case 30 in a state of being protruded toward the opened surface, and accordingly, one surface of the cap assembly 40 acts as the first electrode 50.

The second electrode tab 61 is protruded in a direction of a lower surface of the case 30, which is opposite to the opened surface of the case 30, and coupled to an inner surface of the case 30, and accordingly, the lower surface of the case 30 acts as a second electrode 60.

The first electrode 50 and the second electrode 60 may be a positive electrode and a negative electrode, respectively.

In order to check the performance of newly developed and manufactured battery cells, a process of measuring an electrode potential of a battery cell is performed.

The method for measuring an electrode potential of a three electrode system composed of a reference electrode, a working electrode, and a counter electrode is mainly used for measurement of an electrode potential.

The reference electrode is an electrode used to make a battery circuit for measuring an electrode potential by combining electrodes so as to measure the potential of the electrode constituting the battery or the electrodes causing an electrolysis, and acts as a reference for potentials when measuring the relative value of electrode potential.

Figure 2:
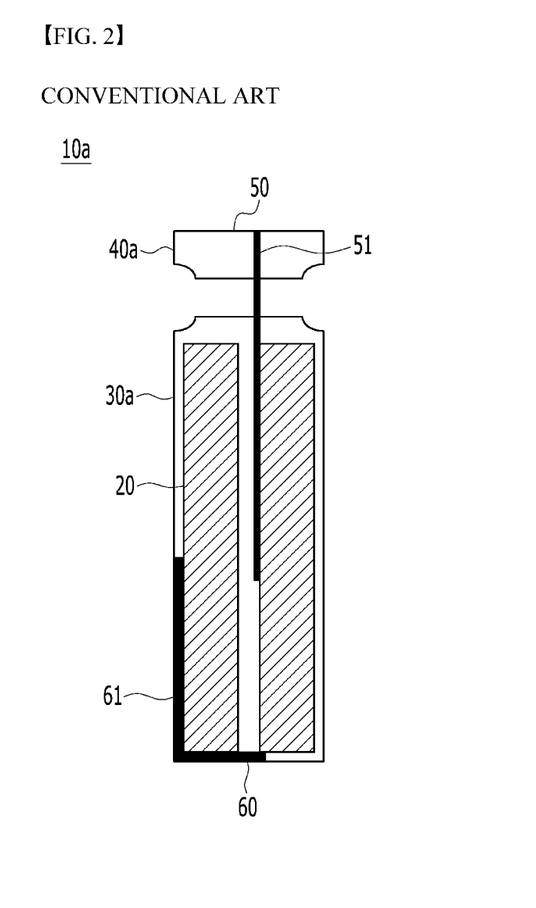
FIG. 2 is a schematic diagram illustrating a state after a beaded part of the cylindrical secondary battery of FIG. 1 is cut for measurement of an electrode potential.

FIG. 2 is a schematic diagram illustrating a state after a beaded part of the cylindrical secondary battery of FIG. 1 is cut for measurement of an electrode potential.

Referring to FIG. 2, the beaded part 31 of the secondary battery 10 of FIG. 1 is cut to measure an electrode potential. That is, the separated cylindrical secondary battery 10a is configured of a cap assembly 40a, of which a lower portion is opened, and a case 30a, of which an upper portion is opened, and the first electrode tab 51 is maintained while not being cut.

Figure 3:
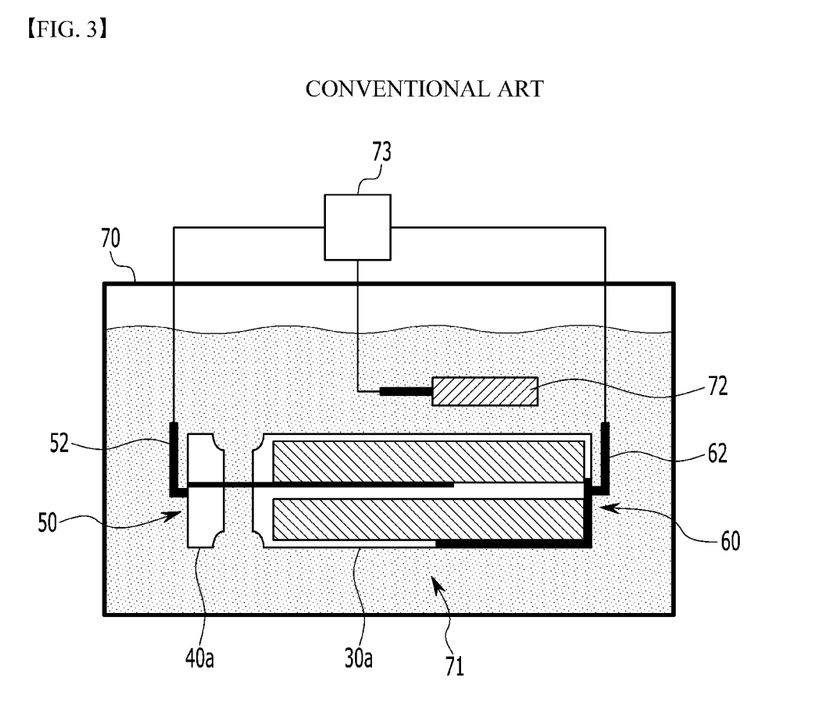
FIG. 3 is schematically a schematic diagram illustrating a method for measuring an electrode potential according to the related art.

FIG. 3 is schematically a schematic diagram illustrating a method for measuring an electrode potential according to the related art.

Referring to FIG. 3, the separated cylindrical secondary battery 10a is sealed in a tray 70 while being immersed in an electrolyte 71, and a working electrode terminal 52 and a counter electrode terminal 62 for measuring electrode potentials, are respectively connected to the first electrode 50 and the second electrode 60.

The working electrode terminal 52 and the counter electrode terminal 62 are connected to a measurement unit 73 together with the reference electrode terminal 72 to measure the electrode potential of the cylindrical secondary battery 10a.

However, in the conventional method for measuring an electrode potential, even though the cylindrical secondary battery 10a is identical, the data values may vary depending on a procedure or a method of measurement by an operator. In particular, in the conventional method, it is difficult to closely control the charging amount of the electrolyte, and when the electrolyte is excessively charged, there may be significant deviations in the measured data values.

Further, the conventional method is performed by immersing the cylindrical secondary battery 10a in the electrolyte, there is a problem that an amount of electrolyte may be excessively used more than necessary.

Therefore, the conventional method for measuring an electrode potential of a three electrode system has many problems, and thus, there is a great need to develop a technology for solving the above-mentioned problems.

DETAILED DESCRIPTION OF THE INVENTION

Technical Problem

Embodiments of the present disclosure have been designed to solve the above-mentioned problems of the existing proposed methods, and an object of the present disclosure is to provide a device for measuring an electrode potential, which enables consistent measurement of data and can minimize the amount of the electrolyte used.

However, the problem to be solved by embodiments of the present disclosure is not limited to the above-described problems, and can be variously expanded within the scope of the technical idea included in the present disclosure.

Technical Solution

A device for measuring electrode potential according to an embodiment of the present disclosure includes a body having an insertion portion configured to receive a cylindrical secondary battery with a separated beaded part is formed on one surface thereof, a cover covering the one surface of the body, a working electrode terminal fixed to the body and connectable to a first electrode of the cylindrical secondary battery; and a counter electrode terminal fixed to the body part and connectable to a second electrode of the cylindrical secondary battery, wherein the insertion portion includes a first insertion portion, into which a cap assembly of the cylindrical secondary battery is insertable, a second insertion portion, into which a case of the cylindrical secondary battery is insertable, and a third insertion portion, into which a first electrode tab of the cylindrical secondary battery is insertable, wherein the second insertion portion includes a case insertion portion, into which the case of the cylindrical secondary battery is insertable, and an injection portion, into which an electrolyte is injectable, that extends from the case insertion part toward the third insertion portion, and wherein a reference electrode terminal is connected to the injection portion.

The working electrode terminal may include a working electrode terminal spring protruding toward a space formed by the first insertion portion.

The counter electrode terminal may include a counter electrode terminal spring protruding toward a space formed by the second insertion portion.

The first insertion portion and the second insertion portion may include an inner surface recessed in a semicircular shape.

The third insertion portion may have a slit shape.

The body may include a seal member formed at at least a portion of a periphery of the one surface thereof.

A width of the case insertion portion may be larger than a width of the injection portion.

The diameter of the case of the cylindrical secondary battery may be smaller than the width of the case insertion portion and may be larger than the width of the injection portion.

A stepped portion may be formed between the case insertion portion and the injection portion, and the second insertion portion of the body may include a first packing part located at the stepped portion.

The cover may include a fourth insertion portion recessed in a semicircular shape at a location corresponding to the first insertion portion of the body, a fifth insertion portion recessed in a semicircular shape at a location corresponding to the case insertion portion of the body, and an observation portion recessed at a location corresponding to the injection portion of the body.

The observation portion may include a transparent part including a transparent material, and the transparent part may be located so as to correspond to the injection portion.

The transparent part may be connected to the cover such that the observation portion is opened and closed.

The cover may include a second packing part located between the fourth insertion portion and the observation portion, and the second packing part may protrude toward the body so as to be inserted into the third insertion portion.

The fifth insertion portion may include a third packing part formed at an end thereof in a direction of the observation portion, and the third packing part may surround an edge of the end of the fifth insertion portion.

The reference electrode terminal may have a first end connected to the injection portion and a second end extending outside the body while the reference electrode terminal is fixed to the body.

A recess connected to the injection portion may be formed in the body, and the reference electrode terminal may be mounted in the recess.

The cover may include a fourth packing part inserted into the recess, in which the reference electrode terminal is mounted.

The injection portion may include a protrusion protruding toward a spot between the first electrode tab and the reference electrode terminal.

The body may be formed of a material that is not reactive to the electrolyte, and may include at least one of Teflon or high-density polyethylene.

The device for measuring electrode potential may further include a fixing part fixing the body and the cover to each other.

Advantageous Effects

According to the embodiments of the present disclosure, the potential measurement is performed in a state the secondary battery is inserted into the insertion part, so that data can be consistently measured.

Further, the constant amount of the electrolyte can be charged through the injection part, and the amount of the electrolyte used can be significantly reduced.

DETAILED DESCRIPTION OF THE EMBODIMENTS

Hereinafter, various embodiments of the present disclosure will be described in detail with reference to the accompanying drawings so that those skilled in the art can easily implement them. The present disclosure may be modified in various different ways, and is not limited to the embodiments set forth herein.

Portions that are irrelevant to the description will be omitted to clearly describe the present disclosure, and like reference numerals designate like elements throughout the specification.

Further, in the figures, the size and thickness of each element are arbitrarily illustrated for convenience of description, and the present disclosure is not necessarily limited to those illustrated in the drawings. In the figures, the thickness of layers, regions, etc. are exaggerated for clarity. In the drawings, for convenience of description, the thicknesses of some layers and regions are shown to be exaggerated.

In addition, it will be understood that when an element such as a layer, film, region, or plate is referred to as being "on" or "above" another element, it can be directly on the other element or intervening elements may also be present. In contrast, when an element is referred to as being "directly on" another element, it means that other intervening elements are not present. Further, the word "on" or "above" means disposed on or below a reference portion, and does not necessarily mean being disposed on the upper end of the reference portion toward the opposite direction of gravity.

Further, throughout the specification, when a portion is referred to as "including" a certain component, it means that it can further include other components, without excluding the other components, unless otherwise stated.

Further, throughout the specification, when referred to as "planar", it means when a target portion is viewed from the top, and when referred to as "cross-sectional", it means when a target portion is viewed from the side of a cross section cut vertically.

Figure 4:
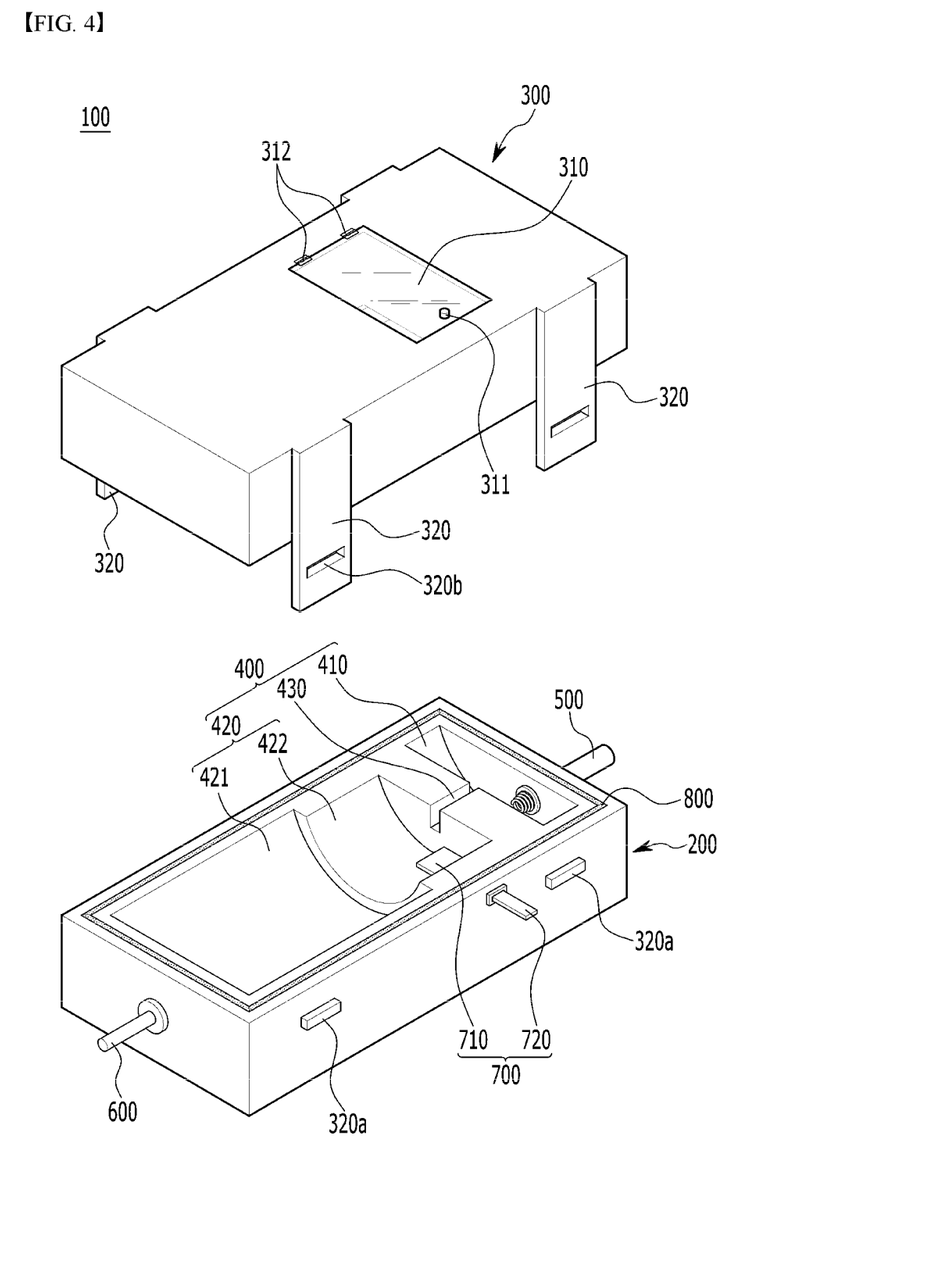
FIG. 4 is a schematic perspective view illustrating a device for measuring an electrode potential according to an embodiment of the present disclosure.

FIG. 4 is a schematic perspective view illustrating a device 100 for measuring an electrode potential according to an embodiment of the present disclosure.

Referring to FIG. 4, the device 100 for measuring electrode potential according to the present embodiment includes a body part 200, in which an insertion part 400, into which a cylindrical secondary battery with a separated beaded part is inserted, is formed on one surface thereof, a cover part 300 covering the one surface of the body part 200, a working electrode terminal 500 fixed to the body part 200 and connected to a first electrode of the cylindrical secondary battery, and a counter electrode terminal 600 fixed to the body part 200 and connected to a second electrode of the cylindrical secondary battery.

Referring to FIG. 2, the separated cylindrical secondary battery 10a of FIG. 2 may be inserted into an insertion part 400, the first electrode 50 of the cylindrical secondary battery 10a may contact the working electrode terminal 500 to be connected thereto, and the second electrode 60 of the cylindrical secondary battery 10a may be in contact with the counter electrode terminal 600 to be connected thereto. This will be described in FIGS. 5, 6, and 8 in detail again.

The insertion part 400 includes a first insertion part 410, into which a cap assembly 40a is inserted, a second insertion part 420, into which a case 30a is inserted, and a third insertion part 430, into which a first electrode tab 51 is inserted. The third insertion part 430 connects the first insertion part 410 and the second insertion part 420.

Figure 5:
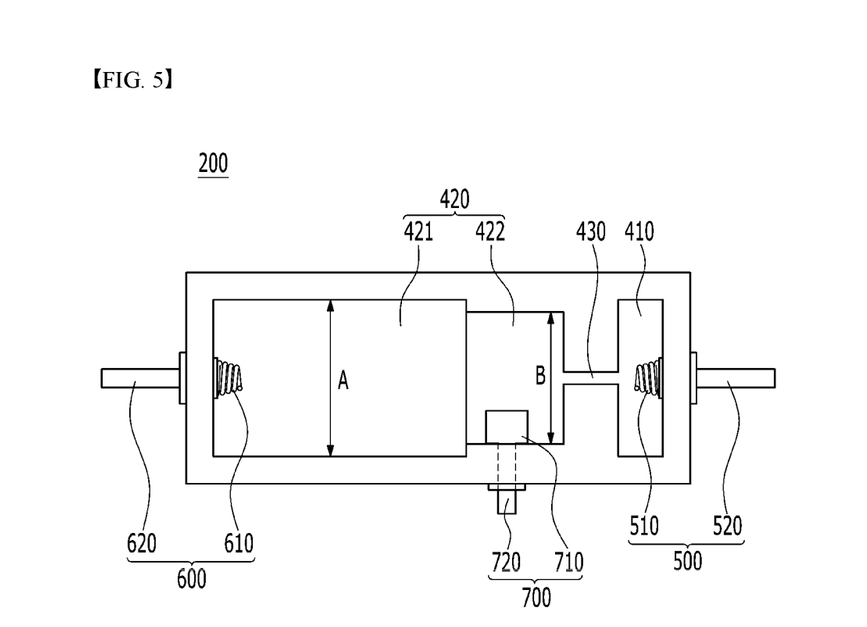
FIG. 5 is a view of a body part of FIG. 4, which is viewed from the top.

FIG. 5 is a view of the body part 200 of FIG. 4 on the plane, which is viewed from the top.

Referring to FIGS. 4 and 5, the second insertion part 420 includes a case insertion part 421, into which the case 30a of FIG. 2 is inserted, and an injection part 422 that extends from the case insertion part 421 to an opening direction of the case 30a and can inject an electrolyte.

A reference electrode terminal 700 is connected to the injection part 422. The form of the reference electrode terminal 700 is not limited, but the reference electrode terminal 700 may be strongly pressed to be formed such that the lithium metal plate 710 and the reference electrode tab 720 may be fixed to each other after a reference electrode tab 720 is inserted into a lithium metal plate 710

The reference electrode terminal 700 is configured, one end of which is connected to the injection part 422 and an opposite end of which extends to the outside while the reference electrode terminal 700 is fixed to the body part 200. In more detail, the reference electrode tab 720 may be fixed to the body part 200 to extend to the outside, and the lithium metal plate 710 may be located at a space formed by the injection part 422.

Because the lithium metal plate 710 is easily detached from the reference electrode tab 720 due to soft properties of lithium even though the reference electrode tab 720 is fixed to the body part 200, the lithium metal plate 710 can be replaced.

Meanwhile, although not illustrated in detail, a rubber packing may be provided to prevent leakage of the electrolyte at the part in which the reference electrode tab 720 is fixed to the body part 200.

Each of the first insertion part 410 and the second insertion part 420 may include an inner surface recessed in a semicircular shape. That is, the first insertion part 410 may include the inner surface formed so as to correspond to the cylindrical shape of the cap assembly 40a inserted into the first insertion part 410, and the second insertion part 420 may include the inner surface formed so as to correspond to the cylindrical shape of the case 30a inserted into the second insertion part 420.

Accordingly, the cap assembly 40a and the case 30a may be seated on and be fixed to the body part 200.

However, in the second insertion part 420, it is preferable that a longitudinal length A of the case insertion part 421 is larger than a longitudinal length B of the injection part 422. That is, it is preferable that an imaginary radius of a semicircular inner surface of the case insertion part 421 is larger than an imaginary radius of a semicircular inner surface of the injection part 422. This prevents the case 30a inserted into the case insertion part 421 from being pushed out to a direction in which the injection part 422 is located and being separated. It will be described below in FIG. 8 again.

Accordingly, it is preferable that the diameter length of the inserted case 30a is smaller than the longitudinal length A of the case insertion part 421 and larger than the longitudinal length B of the injection part 422.

Meanwhile, the third insertion part 430 may have a slit shape such that the first electrode tab 51 of the cylindrical secondary battery 10a may be inserted thereto. In addition, the slit depth of the third insertion part 430 may not be larger than that of the first insertion part 410 or the second insertion part 420 in consideration of the location and the thickness of the first electrode tab 51.

Figure 6:
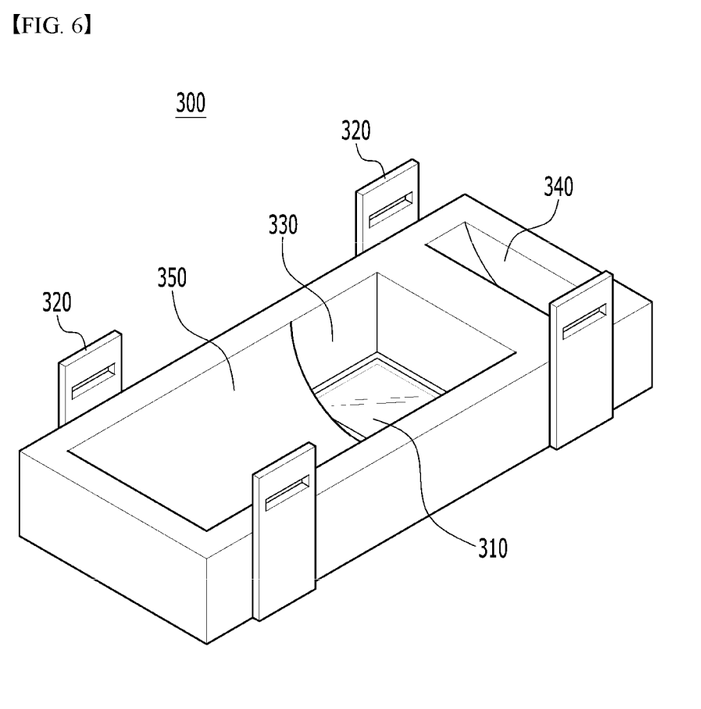
FIG. 6 is a perspective view illustrating a state in which a cover part of FIG. 4 is turned over such that a lower surface of the cover part faces the top.

FIG. 6 is a perspective view illustrating a state in which a cover part 300 of FIG. 4 is turned over such that a lower surface of the cover part faces the top.

Referring to FIG. 6 together with FIG. 4, the cover part 300 may include a fourth insertion part 340 recessed in a semicircular shape at a location corresponding to the first insertion part 410 of the body part 200, and a fifth insertion part 350 recessed in a semicircular shape at a location corresponding to the case insertion part 421 of the body part 200. The fourth insertion part 340 and the fifth insertion part 350 are formed on a lower surface of the cover part 300, that is, on a surface facing the body part 200.

Accordingly, when the cover part 300 covers the body part 200 in which the cylindrical secondary battery is located, the cap assembly 40a of the cylindrical secondary battery may be surrounded by the inner surfaces of the first insertion part 410 and the fourth insertion part 340, and the case 30a of the cylindrical secondary battery may be surrounded by the inner surfaces of the case insertion part 421 and the fifth insertion part 350.

Meanwhile, the cover part 300 may include an observation part 330 recessed at a location corresponding to the injection part 422 of the body part 200, and a transparent part 310 may be formed in the observation part 330. The transparent part 310 will be described below in detail again.

Figure 7:
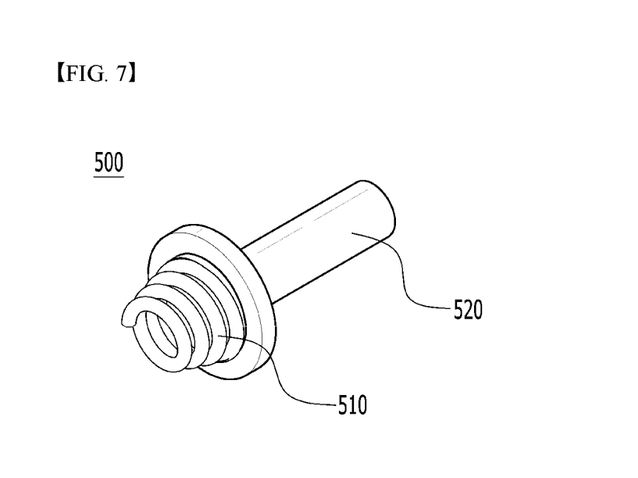
FIG. 7 is a perspective view illustrating a working electrode terminal of FIG. 5.

FIG. 7 is a perspective view illustrating a working electrode terminal 500 of FIG. 5.

Referring to FIGS. 5 and 7 together, the working electrode terminal 500 may include a working electrode terminal spring part 510 protruding toward a space formed by the first insertion part 410, and an external terminal part 520 for connecting an external current line. It is preferable that the working electrode terminal 500 including the working electrode terminal spring part 510 and the external terminal part 520 includes a conductive object.

The working electrode terminal 500 is adapted to measure a voltage of the first electrode 50 of the cylindrical secondary battery 10a, and the working electrode terminal spring part 510 may be attached to the first electrode 50 to make contact therewith.

Unless the working electrode terminal 500 makes close contact with the first electrode 50, contact resistance increases, causing a problem in consistently measuring data, but the present embodiment can solve such a problem through the working electrode terminal spring part 510.

Further, in a method for measuring an electrode potential according to the related art in FIG. 3, it is necessary to weld the first electrode 50 and the working electrode terminal 52 to each other through resistance welding and the like whenever measurements are performed, which is bothersome. Unlike this, in the present embodiment, the first electrode 50 and the working electrode terminal 500 may be electrically connected to each other due to the working electrode terminal spring part 510 simply by inserting the cap assembly 40a is into the first insertion part 410, which is convenient.

In addition, the working electrode terminal spring part 510 may also function to fix the cap assembly 40a to the first insertion part 410 by using an elastic force.

Meanwhile, the counter electrode terminal 600 may include a counter electrode terminal spring part 610 protruding toward a space formed by the second insertion part 420, and an external terminal part 620 for connecting an external current line. It is preferable that the counter electrode terminal 600 including the counter electrode terminal spring part 610 and the external terminal part 620 includes a conductive object.

The counter electrode terminal 600 is adapted to measure a voltage of the second electrode 60 of the cylindrical secondary battery 10a, and the counter electrode terminal spring part 610 may be attached to the second electrode 60 to make contact therewith.

Like the above-mentioned working electrode terminal 500, the counter electrode terminal 600 may make close contact with the second electrode 60 through the counter electrode terminal spring part 610 without any troublesome process such as welding. Further, the case 30a may be fixed to the case insertion part 421 by an elastic force of the counter electrode terminal spring part 610.

Figure 8:
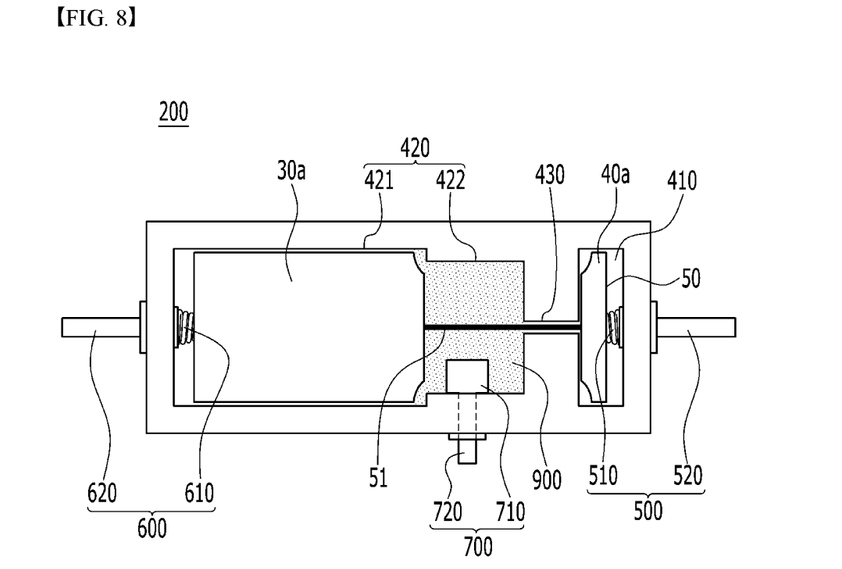
FIG. 8 is a view illustrating a state in which the cylindrical secondary battery of FIG. 2 is inserted into the body part of FIG. 5.

FIG. 8 is a view illustrating a state in which the cylindrical secondary battery 10a of FIG. 2 is inserted into the body part 200 of FIG. 5.

Referring to FIG. 8, the cap assembly 40a is inserted into the first insertion part 410 while the first electrode 50 makes contact with the working electrode terminal spring part 510. As described above, the cap assembly 40a may be fixed to the interior of the first insertion part 410 by the elastic force of the counter electrode terminal spring part 510.

The case 30a is inserted into the case insertion part 421 while the second electrode 60 makes contact with the counter electrode terminal spring part 610. As described above, the case 30a may be fixed in the case insertion part 421 by the elastic force of the counter electrode terminal spring part 610, and the case 30a is not be pushed out to a direction in which the injection part 422 is located by the difference between the longitudinal lengths of the case insertion part 421 and the injection part 422.

The electrolyte 900 is injected into the injection part 422, and the reference electrode terminal 700 and the first electrode tab 51 are immersed in the injected electrolyte 900. Further, the case 30a inserted into the case insertion part 421 is opened in a direction in which the injection part 422 is located due to of cutoff of the beaded part, and thus the injected electrolyte 900 naturally flows to enter the opened part of the case 30a.

Moreover, a slope inclined downwards in the direction of the case insertion part 421 may be formed on the inner surface of the injection part 422 such that the electrolyte may naturally flow toward the case 30a inserted into the case insertion part 421.

In this state, the electrode potential of the cylindrical secondary battery 10a may be measured by measuring voltages from the working electrode terminal 500, the counter electrode terminal 600, and the reference electrode terminal 700, respectively.

Unlike the method for measuring the electrode potential according to the related art in FIG. 3, in the present embodiment, the amount of the electrolyte 900 injected through the injection part 422 may be constantly adjusted, and thus consistent measurement data can be obtained in spite of different operators.

Further, the working electrode terminal 500 and the counter electrode terminal 600 make contact with the first electrode 50 and the second electrode 60, respectively, by using the elastic forces of both the spring parts 510 and 610, and thus it is helpful to obtaining a consistent data value.

Further, a plurality of cylindrical secondary battery suitable for the standards can be conveniently measured repeatedly by taking out the completely measured cylindrical battery and inserting the next cylindrical battery. In addition to the simplicity in process, it has an advantage of forming consistent data for the cylindrical secondary batteries of the standards as compared with the conventional method of forming a system for measuring an electrode potential of three electrodes every time.

Further, as compared with the related art, the amount of the injected electrolyte 900 may be significantly reduced, and thus it can prevent waste of raw materials and reduce the possibility of corrosion of components.

Further, when the end of the cap assembly 40a and the end of case 30a contact each other in a process of measuring the electrode potential, an internal short-circuit may be caused, and accordingly, the chemical properties or performance of the electrode assembly 20 may change so that the electrode potential cannot be exactly measured. The conventional method for measuring an electrode potential in FIG. 3 has a danger, but in the present embodiment, the cap assembly 40a and the case 30a are inserted into the first insertion part 410 and the second insertion part 420, respectively, and thus the internal short-circuit problem can be effectively prevented.

Meanwhile, referring to FIG. 4 again, the body part 200 may include a seal member 800 formed at at least a portion of a periphery of one surface on which the insertion part 400 is formed.

The seal member 800 is a member for sealing the cover part 300 and the body part 200 when the cover part 300 covers the one surface of the body part 200, and it is not particularly limited, but it is preferable that the seal member 800 includes at least one of a synthetic rubber and a silicone-based resin.

Meanwhile, referring to FIGS. 4 and 6 together, the observation part 330 of the cover part 300 may include the transparent part 310 including a transparent material, and the transparent part 310 may be located so as to correspond to the injection part 422 on a plane. The transparent part 310 is a configuration disposed to visually check whether the reference electrode terminal 700 is completely immersed in the electrolyte when the electrolyte is injected into the cylindrical secondary battery through the injection part 422.

Further, the transparent part 310 includes a hinge unit 312 hinge-coupled to the cover part 300 on one side, and a handle 311 disposed on an opposite side, which is opposite to the one side, and thus a structure, which can be opened and closed, may be provided.

Accordingly, after the transparent part 310 is opened while the cover part 300 is fixed to the body part 200, the electrolyte may be injected into the injection part 422 through the opened transparent part 310. That is, the transparent part 310 in the present embodiment may function as an observation window, and as an electrolyte injection hole together.

Meanwhile, the device for measuring an electrode potential may further include a fixing part 320, which fixes the body part 200 and the cover part 300 to each other.

In detail, as illustrated in FIG. 4, the plurality of fixing parts 320 are located on opposite side surfaces of the cover part 300, and a plurality of bosses 320a may be provided on opposite side surfaces of the body part 200 so as to correspond to the fixing parts 320, respectively.

The bosses 320a are inserted into through-holes 320b of the fixing part 320, and thus the body part 200 and the cover part 300 may be fixed to each other.

The fixing part 320 in FIG. 4 is an example for fixing the body part 200 and the cover part 300 each other, and a detailed shape or number may be freely modified if it may be fixed.

Meanwhile, it is preferable that the body part 200 including the inner surface of the insertion part 400 includes a material that does not react to the electrolyte. In particular, it is preferable that the inner surface of the injection part 422, into which the electrolyte is directly injected, includes a material that does not react with the electrolyte. This prevents the material constituting the body part 200 from reacting with the electrolyte and affecting the measurement of an electrode potential. it is preferable that the material includes at least one of chemical resistant polymer plastic materials such as Teflon and high-density polyethylene (HDPE).

Figure 9:
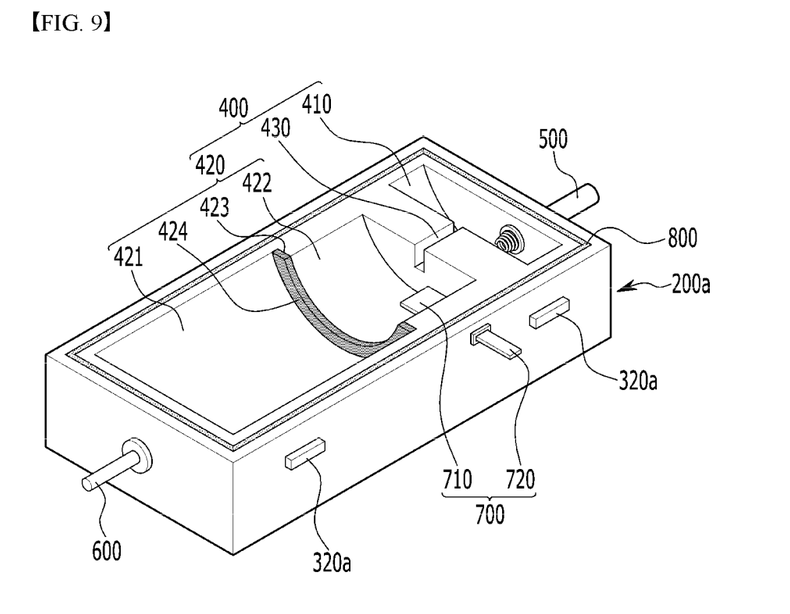
FIG. 9 is a perspective view illustrating the body part including a first packing part.

FIG. 9 illustrates a modified embodiment of the present disclosure, and is a perspective view illustrating the body part 200a including a first packing part 424.

Referring to FIG. 9, the body part 200a includes a case insertion part 421, into which the case of the cylindrical secondary battery is inserted, and an injection part 422, into which the electrolyte is inserted. The configuration in which the longitudinal lengths of the case insertion part 421 and the injection part 422 are different such that the case is not pushed out to a direction in which the injection part 422 is located is the same as the contents described in FIGS. 5 and 8

That is, a stepped portion 423 may be formed between the case insertion part 421 and the injection part 422 such that the case is not pushed out to a direction in which the injection part 422 is located.

Here, it is preferable that the electrolyte injected into the injection part 422 flows into the opened part of the case, but it is not preferable that the electrolyte flows to a space between the case and the inner surfaced of the case insertion part 421.

Accordingly, the second insertion part 420 of the body part 200a according to the modified embodiment of the present disclosure includes a first packing part 424 located at the stepped portion 423, and thus the electrolyte injected into the injection part 422 can be prevented from flowing to between the case and the inner surface of the case insertion part 421. It is preferable that the first packing part 424 includes a material such as rubber.

Figure 10:
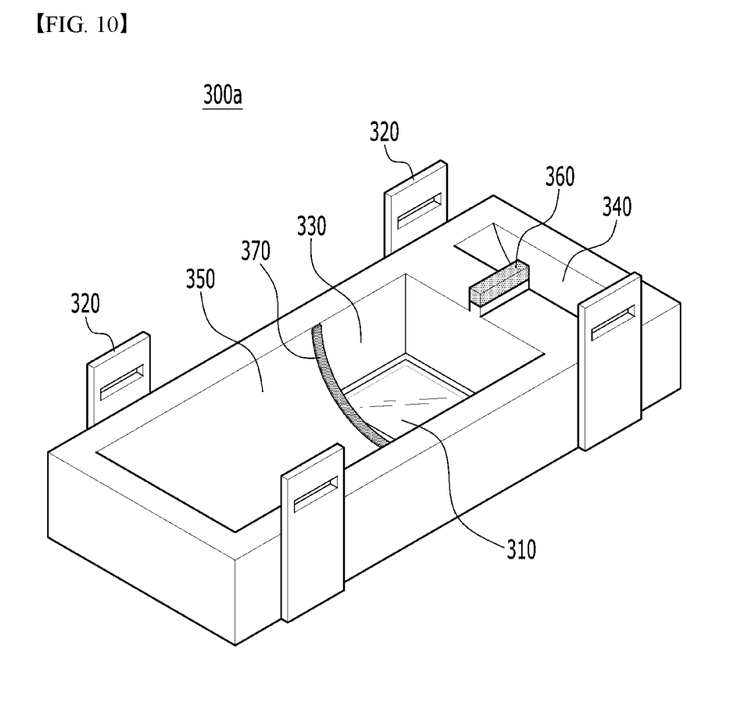
FIG. 10 is a perspective view illustrating the cover part including a second packing part and a third packing part.

FIG. 10 illustrates a modified embodiment of the present disclosure, and is a perspective view illustrating the cover part 300a including a second packing part 360 and a third packing part 370.

Referring to FIG. 10, the configuration in which the cover part 300a includes a fourth insertion part 340, a fifth insertion part 350, and an observation part 330 is the same as the contents illustrated in FIG. 6.

Here, the cover part 300a according to the modified embodiment of the present disclosure may include a second packing part 360 located between the fourth insertion part 340 and the observation part 330. The second packing part 360 may protrude toward the body part 200 so as to be inserted into the third insertion part 430 illustrated in FIG. 4.

The electrolyte injected into the injection part 422 through the third insertion part 430, into which the first electrode tab of the cylindrical secondary battery is inserted, may flow into the first insertion part 410.

Here, the second packing part 360 may be inserted into the third insertion part 430 while the first electrode tab is located therebetween, to seal a space formed by the third insertion part 430, and thus the above-mentioned problem can be prevented.

It is preferable that the second packing part 360 includes a material such as rubber for sealing and has the same width as the width of the third insertion part 430. However, it is preferable that the protruding height of the second packing part 360 is somewhat smaller than the depth of the third insertion part 430 so as not to damage the first electrode tab.

Meanwhile, the third packing part 370 may be disposed at the end of the fifth insertion part 350 toward the observation part 330. The third packing part 370 may surround an edge of the end of the fifth insertion part 350. That is, the third packing part 370 may be realized in the form of surrounding the edge of the semicircular inner surface formed by the fifth insertion part 350.

The third packing part 370, similarly to the above-described first packing part 424, can prevent the electrolyte injected into the injection part 422 from flowing into the inner space between the case and the fifth insertion part 350.

The third packing part 370 may include a material, such as rubber, similarly to the first packing part 424.

Figure 11:
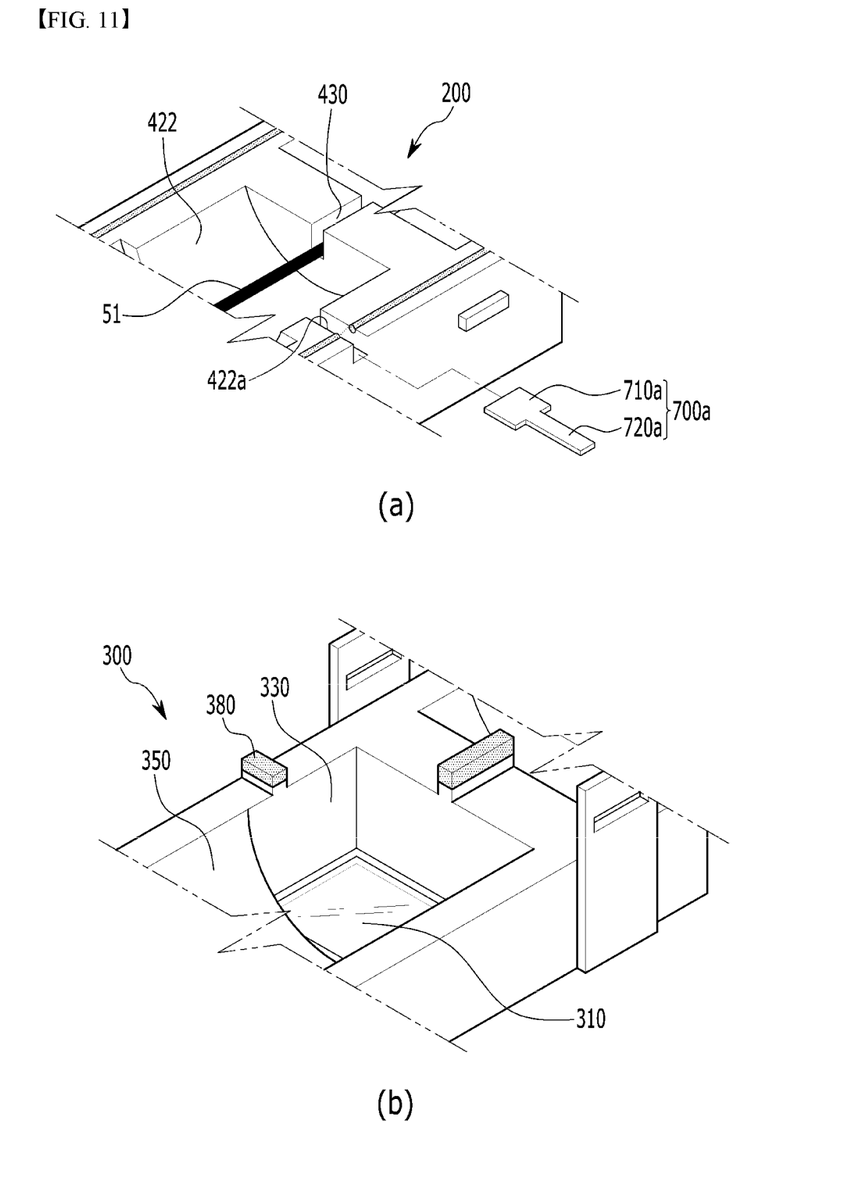
FIG. 11 illustrates a modified embodiment of the present disclosure, and is a partial perspective view illustrating the body part and the cover part for explaining a detachable reference electrode terminal.

FIG. 11 illustrates a modified embodiment of the present disclosure, and is a partial perspective view illustrating the body part and the cover part, for explaining a detachable reference electrode terminal 700a.

Referring to (a) of FIG. 11, a recess 422a connected to the injection part 422 may be formed in the body part 200, and the reference electrode terminal 700a may be mounted in the recess 422a. In detail, the reference electrode tab 720a of the reference electrode terminal 700a may be mounted in the recess 422a, and the lithium metal plate 710a connected to the reference electrode tab 720a may be located in a space in which the injection part 422 is formed. The reference electrode terminal 700a is mounted in the recess 422a, and thus the reference electrode terminal 700a may be replaced more easily.

Meanwhile, referring to (b) of FIG. 11, the cover part 300 may include a fourth packing part 380 capable of being inserted into the recess 422a.

The fourth packing part 380 may be located at a spot corresponding to the location of the recess 422a when the cover part 300 covers the body part 200, to be inserted into the recess 422a in which the reference electrode terminal 700a is mounted. The reference electrode terminal 700a may be easily replaced due to the recess 422a connected to the injection part 422, but the electrolyte also may be leaked. Accordingly, the fourth packing part 380 is inserted into the recess 422a in which the reference electrode terminal 700a is mounted, to interrupt leakage of the electrolyte through the recess 422a.

Figure 12:
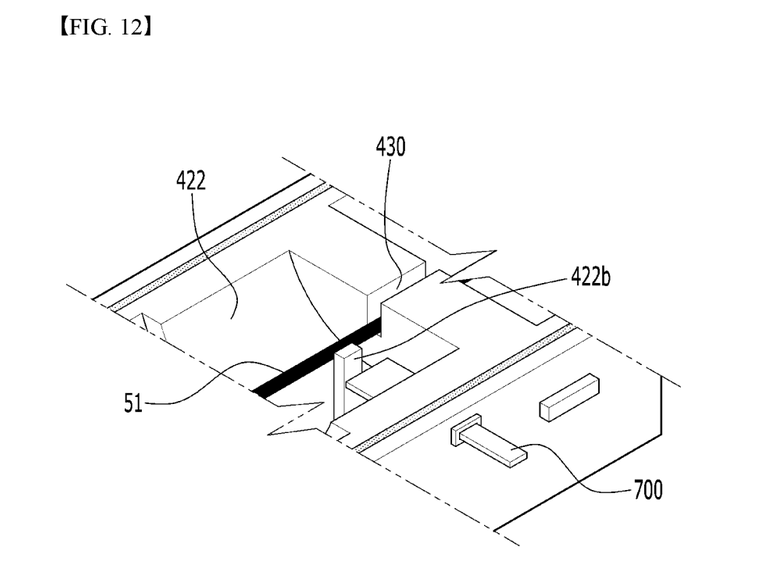
FIG. 12 is a partial perspective view illustrating a device for measuring an electrode potential, which includes a protrusion part.

FIG. 12 illustrates a modified embodiment of the present disclosure, and is a partial perspective view illustrating a device for measuring electrode potential, which includes a protrusion part 422b. In detail, FIG. 12 is a partial perspective view enlarging and illustrating the injection part 422 when the cylindrical secondary battery 10a of FIG. 2 is inserted into the device for measuring electrode potential.

Referring to FIG. 12, the injection part 422 may include a protrusion part 422b protruding toward a spot between the first electrode tab 51 and the reference electrode terminal 700.

As described above, the electrolyte is injected into the injection part 422, and the first electrode tab 51 and the reference electrode terminal 700 are immersed in the electrolyte so that the electrode potential is measured. Here, when the first electrode tab 51 and the reference electrode terminal 700 make contact with each other, an internal short-circuit is caused, and accordingly, the chemical properties or performance of an electrode assembly 20 may change so that the electrode potential cannot be exactly measured.

Accordingly, the injection part 422 includes a protrusion part 422b to prevent the first electrode tab 51 and the reference electrode terminal 700 from making contact with each other.

The protrusion part 422b may not make contact with the reference electrode terminal 700 or the first electrode tab 51, and may be located in a space between the reference electrode terminal 700 and the first electrode tab 51 so as to prevent a contact therebetween. Further, in order to prevent the electrolyte from being separated into the reference electrode terminal 700 and the first electrode tab 51, it is preferable to form a small width.

Meanwhile, in the specification, the first electrode may be a positive electrode and the second electrode may be a negative electrode.

Meanwhile, the device for measuring electrode potential according to the present embodiments may be used to measure a cylindrical secondary battery, and the height and the diameter of the cylindrical secondary battery, which is to be measured, may be considered when the secondary battery is designed. In more detail, the cylindrical secondary battery to be measured may be 18650 battery (diameter: 18 mm, height: 65 mm) or 21700 battery (diameter: 20 mm, height: 70 mm), and the sizes of the body part and the cover part, the longitudinal length of the insertion part or the like may be designed so as to be suitable for the corresponding secondary battery.

However, the above-mentioned secondary batteries are examples of cylindrical secondary batteries, which may be applied to the device for measuring electrode potential according to the present disclosure, and the size of the cylindrical secondary battery, which may be applied, is not limited.

The present disclosure has been described in detail with reference to exemplary embodiments thereof, but the scope of the present disclosure is not limited thereto and modifications and improvements made by those skilled in the part by using the basic concept of the present disclosure, which are defined in the following claims, also belong to the scope of the present disclosure.

The invention claimed is:

1. A device for measuring an electrode potential, the device comprising:

a body having an insertion portion configured to receive a cylindrical secondary battery with a separated beaded part is formed on one surface thereof;
a cover covering the one surface of the body;
a working electrode terminal fixed to the body and connectable to a first electrode of the cylindrical secondary battery; and
a counter electrode terminal fixed to the body and connectable to a second electrode of the cylindrical secondary battery,
wherein the insertion portion comprises a first insertion portion, into which a cap assembly of the cylindrical secondary battery is insertable, a second insertion portion, into which a case of the cylindrical secondary battery is insertable, and a third insertion portion, into which a first electrode tab of the cylindrical secondary battery is insertable,
wherein the second insertion portion comprises a case insertion portion, into which the case of the cylindrical secondary battery is insertable, and an injection portion, into which an electrolyte is injectable, that extends from the case insertion towards the third insertion portion, and
wherein a reference electrode terminal is connected to the injection portion.

2. The device for measuring an electrode potential according to claim 1, wherein
the working electrode terminal comprises a working electrode terminal spring protruding toward a space formed by the first insertion portion.

3. The device for measuring an electrode potential according to claim 1, wherein
the counter electrode terminal comprises a counter electrode terminal spring protruding toward a space formed by the second insertion portion.

4. The device for measuring an electrode potential according to claim 1, wherein
the first insertion portion and the second insertion portion comprise an inner surface recessed in a semicircular shape.

5. The device for measuring an electrode potential according to claim 1, wherein
the third insertion portion has a slit shape.

6. The device for measuring an electrode potential according to claim 1, wherein
the body comprises a seal member formed at at least a portion of a periphery of the one surface thereof.

7. The device for measuring an electrode potential according to claim 1, wherein
a width of the case insertion portion is larger than a width of the injection portion.

8. The device for measuring an electrode potential according to claim 7, wherein a diameter of the case of the cylindrical secondary battery is smaller than the width of the case insertion portion and is larger than width of the injection portion.

9. The device for measuring an electrode potential according to claim 7, wherein
a stepped portion is formed between the case insertion portion and the injection portion, and
the second insertion portion of the body comprises a first packing part located at the stepped portion.

10. The device for measuring an electrode potential according to claim 1, wherein
the cover comprises a fourth insertion portion recessed in a semicircular shape at a location corresponding to the first insertion portion of the body, a fifth insertion portion recessed in a semicircular shape at a location corresponding to the case insertion portion of the body, and an observation portion recessed at a location corresponding to the injection portion of the body.

11. The device for measuring an electrode potential according to claim 10, wherein
the observation portion comprises a transparent part containing a transparent material, and
the transparent part is located so as to correspond to the injection portion.

12. The device for measuring an electrode potential according to claim 11, wherein
the transparent part is connected to the cover such that the observation portion can be opened and closed.

13. The device for measuring an electrode potential according to claim 10, wherein
the cover comprises a second packing part located between the fourth insertion portion and the observation portion, and
the second packing part protrudes toward the body so as to be inserted into the third insertion portion.

14. The device for measuring an electrode potential according to claim 10, wherein
the fifth insertion portion comprises a third packing part formed at an end thereof in a direction of the observation portion, and
the third packing part surrounds an edge of the end of the fifth insertion portion.

15. The device for measuring an electrode potential according to claim 1, wherein
the reference electrode terminal has a first end connected to the injection portion and a second end extending outside of the body while the reference electrode terminal is fixed to the body.

16. The device for measuring an electrode potential according to claim 1, wherein
a recess connected to the injection portion is formed in the body, and
the reference electrode terminal is mounted in the recess.

17. The device for measuring an electrode potential according to claim 16, wherein
the cover comprises a fourth packing part inserted into the recess, on which the reference electrode terminal is mounted.

18. The device for measuring an electrode potential according to claim 1, wherein
the injection portion comprises a protrusion protruding toward a spot between the first electrode tab and the reference electrode terminal.

19. The device for measuring an electrode potential according to claim 1, wherein
the body is formed of a material that is not reactive to the electrolyte, and comprises at least one of Teflon or high-density polyethylene.

20. The device for measuring an electrode potential according to claim 1, further comprising
a fixing part fixing the body and the cover to each other.

* * * * *